United States Patent [19]
Okutomo et al.

[11] Patent Number: 5,359,222
[45] Date of Patent: Oct. 25, 1994

[54] TCP TYPE SEMICONDUCTOR DEVICE CAPABLE OF PREVENTING CROSSTALK

[75] Inventors: Takayuki Okutomo; Morihiko Ikemizu, both of Kawasaki, Japan

[73] Assignee: Kabushiki Kaisha Toshiba, Kawasaki, Japan

[21] Appl. No.: 11,133

[22] Filed: Jan. 29, 1993

[30] Foreign Application Priority Data

Jan. 31, 1992 [JP] Japan ................................ 4-017097
Nov. 14, 1992 [JP] Japan ................................ 4-328893

[51] Int. Cl.$^5$ ................ H01L 23/48; H01L 29/44; H01L 29/52; H01L 29/60
[52] U.S. Cl. ................ 257/659; 257/691; 257/666
[58] Field of Search ............ 257/691, 668, 666, 668, 257/659, 660, 662; 437/217, 206, 220

[56] References Cited

U.S. PATENT DOCUMENTS

| | | | |
|---|---|---|---|
| 4,891,687 | 1/1990 | Mallik et al. | 257/691 |
| 4,992,628 | 2/1991 | Beppu et al. | 257/668 |
| 5,220,196 | 6/1993 | Michi et al. | 257/787 |

FOREIGN PATENT DOCUMENTS

60-154644  8/1985  Japan ................................ 257/691

OTHER PUBLICATIONS

VLSI Packaging Trends –An Update, J. C. Miller, ITAB '90 Proceedings. pp. 7–17, (1990).
Using Advanced Pulsed Hotbar Solder Technology for Reliable Positioning and Mounting of High Lead Count Flat Packs and Tab Devices, ITAB '90 Proceedings, pp. 230–249, (1990).

*Primary Examiner*—Rolf Hille
*Assistant Examiner*—S. V. Clark
*Attorney, Agent, or Firm*—Finnegan, Henderson, Farabow, Garrett & Dunner

[57] ABSTRACT

A wiring pattern having a plurality of leads is formed on the under surface of an insulating film. The inner lead portion of each of the leads is bonded to a corresponding one of bump electrodes formed on pads of a semiconductor chip and the outer lead portion thereof is connected to a corresponding lead wire formed on a printed circuit board. The outer lead portion of one of the leads which acts as a ground line is connected to a grounded lead wire which is formed on the printed circuit board. A shield plate is bonded to the under surface of the leads via insulating adhesive agent. The shield plate is electrically connected to the grounded lead wire. The semiconductor chip and the inner lead portions are hermetically sealed by use of potting resin.

9 Claims, 9 Drawing Sheets

TCP TYPE SEMICONDUCTOR DEVICE CAPABLE OF PREVENTING CROSSTALK

BACKGROUND OF THE INVENTION

1. Field of the Invention

This invention relates to a tape carrier package (TCP) type semiconductor device, and more particularly to a semiconductor device capable of preventing crosstalk which may be caused to easily occur with an increase in the number of pins used and miniaturization and having an excellent high frequency characteristic.

2. Description of the Related Art

Conventionally, the package structure of a semiconductor device includes a ceramic package used for hermetically sealing a semiconductor device having an integrated circuit formed thereon into a ceramic container formed of alumina, for example, a plastic package obtained by molding a semiconductor chip by use of resin, and a potting resin sealed plastic package used for hermetically sealing a semiconductor chip by mounting the semiconductor chip on a carrier tape and dropping liquid resin on the semiconductor chip.

The carrier tape is also called a TAB (Tape Automated Bonding) tape and a wiring pattern (lead) is formed by laminating a Cu foil, for example, on an insulating film such as a polyimide film and subjecting the Cu foil to the photoetching process. A bump electrode is formed on the semiconductor chip, the wiring pattern formed on the carrier tape is bonded to the bump electrode, then potting resin is dropped on the inner lead portion of the wiring pattern and the semiconductor chip and heat treatment is effected to cure potting resin. Alternatively, the inner lead portion of the wiring pattern and the semiconductor chip are hermetically sealed by use of mold resin instead of the potting resin.

For example, the above TAB technique is disclosed in PROCEEDINGS SECOND INTERNATIONAL TAB SYMPOSIUM FEB. 5-7, 1990 pp. 7-15 "VLSI PACKAGING TRENDS-AN UPDATE" J. Courtney Miller and pp. 230-249 "USING ADVANCED PULSED HOTBAR SOLDER TECHNOLOGY FOR RELIABLE POSITIONING AND MOUNTING OF HIGH LEAD COUNT FLAT PACKS AND TAB DEVICES" Gero Zimmer.

Recently, the number of pins used is increased with an increase in the integration density and the number of functions of the semiconductor device and miniaturization of the semiconductor device, and the width of the lead formed on the carrier tape and the distance between the leads are reduced. Therefore, if adjacent leads are signal lines or power source lines, a magnetic field is generated by currents flowing in the leads according to the corkscrew rule to cause crosstalk. As a result, a current flowing in the signal line or a voltage thereof may be varied and the semiconductor device will be erroneously operated. The crosstalk becomes significant when the operation frequency becomes high (for example, 100 MHz or more).

In order to prevent the crosstalk, there are proposed various methods effected by increasing the distance between the leads, disposing a ground pattern (grounded lead) between the leads and forming a grounded metal film on the under surface (which is opposite to the top surface on which the wiring pattern is formed) of the carrier tape, for example.

However, if the interval between the leads is increased, it becomes difficult to increase the number of pins which can be used in the semiconductor device. Further, if the ground lead is disposed between the leads, it also becomes difficult to increase the number of pins since the ground lead is not used as a signal line which is required by the semiconductor device. In addition, in order to form the grounded metal film on the under surface of the carrier tape, the following steps may be required, for example, to make the carrier tape forming process complex. That is, for example, a metal film is first formed on the under surface of the carrier tape (insulating film) by evaporation. Next, a through hole is formed in the insulating film to permit the metal film to be grounded. After this, the internal portion of the through hole is metal-plated to electrically connect the metal film and the ground lead in the wiring pattern to each other.

Further, a problem that warp or distortion tends to occur in the carrier tape of the TCP type semiconductor device may occur in addition to the crosstalk. If warp or distortion occurs in the carrier tape, the flatness of the outer lead portion is degraded so as to make it difficult to mount the semiconductor element on a printed circuit board by reflow soldering, thereby causing unsatisfactory mounting. The warp or distortion is caused in the carrier tape by the following factors. First, since the carrier tape having a semiconductor chip mounted thereon is wound on a reel and stored and transferred in this state, the carrier tape tends to curl. The warp or distortion in the carrier tape remains in the form of warp or distortion in the TCP itself after the carrier tape is cut into a short sheet in the unit of single semiconductor chip. The curing process of the potting resin is effected with the carrier tape wound on the reel, and since the heat treatment is effected in the curing process, the warp or distortion further occurs in the carrier tape in the heat treatment process.

As a method for preventing the above warp or distortion from occurring in the carrier tape, a method of bonding a reinforcing plate to the carrier tape by use of adhesive agent is disclosed in Japanese Patent Disclosure No. 3-125440. It is also disclosed in the Patent Disclosure that a metal plate can be used as the reinforcing plate, but the structure disclosed in the Patent Disclosure does not have a function as a shielding plate and cannot be used to prevent the above-described crosstalk. Further, with the structure disclosed in the above Patent Disclosure, a space is formed between the leads and the side surface of the lead is exposed so that the moisture resistance will be lowered, thereby permitting the entrance of moisture and making the insulation between the leads insufficient.

Further, the TCP type semiconductor device has a defect that it is difficult to deal with the semiconductor device for storage and transfer in comparison with the other type package structure after it is divided into individual semiconductor devices. The wire bonding type semiconductor device is stored or transferred while it is set on the packing tray having a supporting member for mounting the outer lead on the bottom surface. The reason why the semiconductor device can be supported on the lead portion is that the lead frame is approximately 150 μm in thickness and is the mechanical strength thereof is high. In contrast, the lead of the TCP type semiconductor device is approximately 35 μm and it is impossible to stably support the main body by mounting the outer lead on the supporting member so that it will become difficult to store and transfer the semiconductor device with the semiconductor device set in the packing tray which is used in the prior art.

SUMMARY OF THE INVENTION

Accordingly, a first object of this invention is to provide a TCP type semiconductor device which has an excellent high frequency characteristic and which can prevent occurrence of crosstalk without making it difficult to increase the number of pins and making the carrier tape forming process complicated.

A second object of this invention is to provide a TCP type semiconductor device which can prevent occurrence of crosstalk and attain the flatness of a carrier tape.

A third object of this invention is to provide a TCP type semiconductor device which can be easily stored and transferred.

The above first and second objects of this invention can be attained by a semiconductor device comprising a semiconductor chip; an insulating film which has a device hole in which the semiconductor chip is disposed; a wiring pattern having leads formed on one of the top and under surfaces of the insulating film and each including an inner lead portion connected to the semiconductor chip and an outer lead portion formed to extend from the inner lead portion; a shield plate disposed to face the under surface of the insulating film; adhesive agent for bonding the shield plate to the under surface of the insulating film; a base plate on which the semiconductor chip is mounted; and a plurality of lead wires formed on the base plate and connected to the outer lead portions, at least one of the plurality of lead wires being grounded and electrically connected to the shield plate.

With the above structure, since the shield plate is provided, the crosstalk can be prevented and the high frequency characteristic can be enhanced. Since the shield plate is bonded to the carrier tape by use of adhesive agent, use of the shield plate will not reduce the number of pins which can be used or will not make the carrier tape forming process complicated. Further, when a metal plate is used as the shield plate, the metal plate generally has high rigidity so that the warp or distortion of the carrier tape can be reduced and the flatness of the carrier tape can be improved.

The above third object of this invention can be attained by a semiconductor device comprising a semiconductor chip; an insulating film which has a device hole in which the semiconductor chip is disposed; a wiring pattern having leads formed on one of the top and under surfaces of the insulating film and each including an inner lead portion connected to the semiconductor chip and an outer lead portion formed to extend from the inner lead portion; a reinforcing plate disposed to face the under surface of the insulating film and having a hole with which a projecting portion of a packing tray is engaged; and adhesive agent for bonding the reinforcing plate to the under surface of the insulating film.

With the above structure, since the semiconductor device can be fixed by engaging the projecting portion formed on the bottom portion of the packing tray with the hole formed in the reinforcing plate, storage and transfer of the semiconductor device can be made simple.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
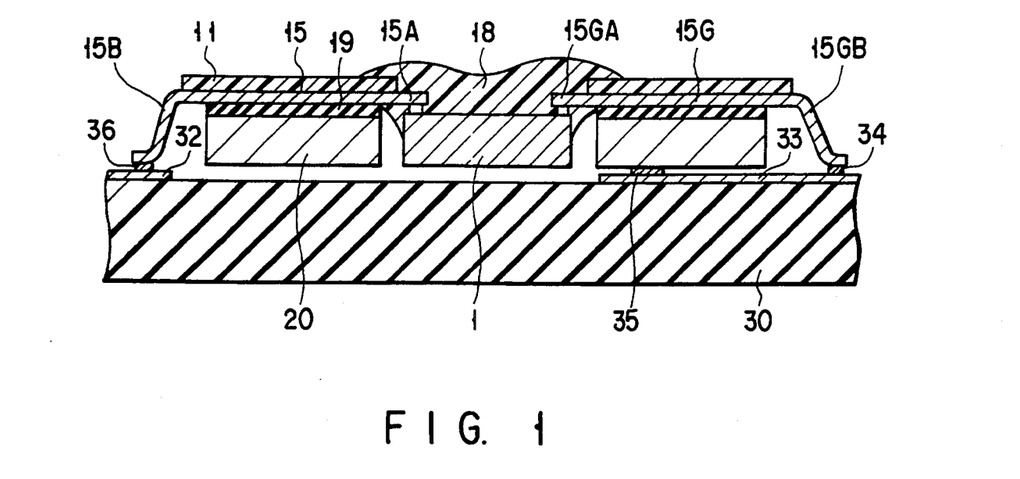
FIG. 1 is a cross sectional view of a semiconductor device according to a first embodiment of this invention which is mounted on a printed circuit board.

FIG. 1 is a cross sectional view of a semiconductor device according to a first embodiment of this invention which is mounted on a printed circuit board. A wiring pattern formed of a plurality of leads 15 is formed on the under surface of an insulating film 11. Inner lead portions 15A of the leads 15 are bonded to corresponding bump electrodes formed on respective pads of a semiconductor chip 1 and outer lead portions 15B are connected to corresponding lead wires 32 formed on a printed circuit board 30 via respective solder layers 36. An inner lead portion 15GA of a lead 15G acting as a ground line among the leads 15 is bonded to a bump electrode formed on a pad of the semiconductor chip 1 and an outer lead portion 15GB thereof is connected to a grounded lead wire 33 via a solder layer 34. A metal plate 20 is attached to the under surfaces of the leads 15 via insulating adhesive agent 19. The metal plate 20 is connected to the lead wire 33 via a solder layer 35. The semiconductor chip 1 and the inner lead portions 15A are hermetically sealed by use of potting resin 18.

Figure 2:
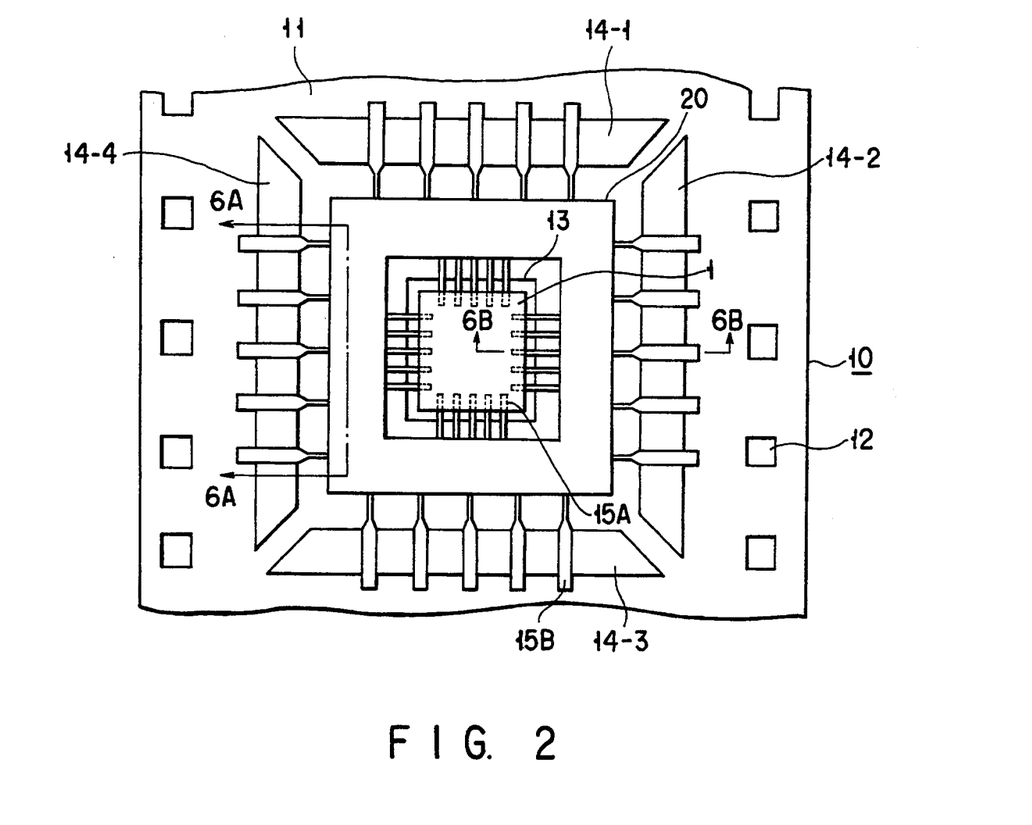
FIG. 2 is a plan view showing a carrier tape used in the semiconductor device shown in FIG. 1.

FIG. 2 shows a carrier tape used in the semiconductor device of FIG. 1 and shows a state in which the semiconductor chip 1 and the metal plate 20 are attached to the carrier tape 10 and the carrier tape 10 is not yet divided into individual semiconductor devices. A plastic film such as a polyimide or polyester film having flexibility can be used as the insulating film 11 used for a base member of the carrier tape 10. In this example, as the insulating film 11, a polyimide film which is approximately 75 to 125 μm in thickness is used. The insulating film 11 is a strip-form member and feeding holes 12 used for feeding the carrier tape 10 in the lengthwise direction thereof are formed at regular intervals on both side end portions thereof. In substantially the central portion of the insulating film 11, a device hole 13 in which the semiconductor chip 1 is disposed is formed. Narrow and trapezoidal openings 14-1 to 14-4 are formed to respectively face the four sides of the device hole 13 and surround the device hole 13.

A wiring pattern is formed on the insulating film 11. The wiring pattern is formed by forming a copper foil with a thickness of approximately 35 μm, for example, on the insulating film 11 by copper plating or sputtering and patterning the copper foil by photoetching. The wiring pattern forms a plurality of leads 15 and the front end portion of each of the inner lead portions 15A is disposed to extend into the device hole 13. Parts of the respective outer lead portions 15B are exposed to the corresponding openings 14-1 to 14-4. In FIG. 2, the leads 15 are formed to extend from the semiconductor chip 1 in four different directions, but it is possible to form them so as to extend in two opposite directions.

The semiconductor chip 1 is disposed in the device hole 13 and the front end portions of the inner lead portions 15A are bonded to pads which are linearly arranged on the semiconductor chip 1 or connection electrodes (not shown) such as bump electrodes formed on the pads. The metal plate 20 is bonded to the wiring pattern forming surface of the leads 15 inside an area of the insulating film 11 surrounded by the openings 14-1 to 14-4 via the insulating adhesive agent 19. As the adhesive agent 19, thermosetting adhesive agent which is cured at a temperature of approximately 150° C. is used. The metal plate 20 is formed by, for example, pressing a pure copper plate by use of a metal mold and is formed in a square frame configuration having an opening in the central portion. In the example of FIG. 2, since connecting portions between the semiconductor chip 1 and the inner lead portions 15A are disposed below the inner lead portions, the semiconductor chip 1 is disposed on the wiring pattern forming surface side of the insulating film 11 which is the same as the metal plate 20. The metal plate 20 is connected to the lead wire 33 which is grounded as shown in FIG. 1 so as to act as a shield plate. The crosstalk between the leads 15 can be prevented by means of the metal plate 20.

The semiconductor chip 1 disposed in the device hole 13 is hermetically sealed together with the surrounding area of the device hole 13 of the insulating film 11 by use of coating resin (potting resin) 18 such as epoxy resin or silicone.

The carrier tape 10 is divided for each semiconductor device and bent the leads so that the outer lead portions 15B can be easily mounted on the printed circuit board. At this time, it is preferable to set the front end portions of the outer lead portions 15B in the same plane as the metal plate 20 and in substantially parallel to the surface of the base plate when the semiconductor device is mounted on the printed circuit board.

Figure 3:
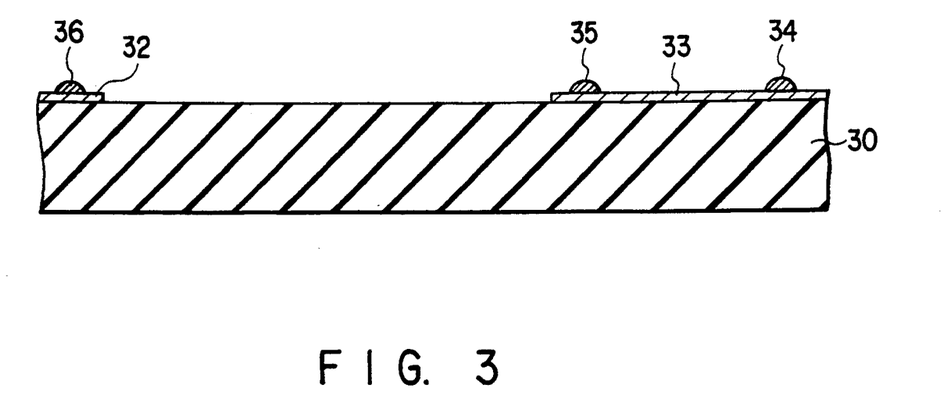
FIG. 3 is an enlarged cross sectional view of the printed circuit board on which the semiconductor device of FIG. 1 is mounted.
Figure 4:
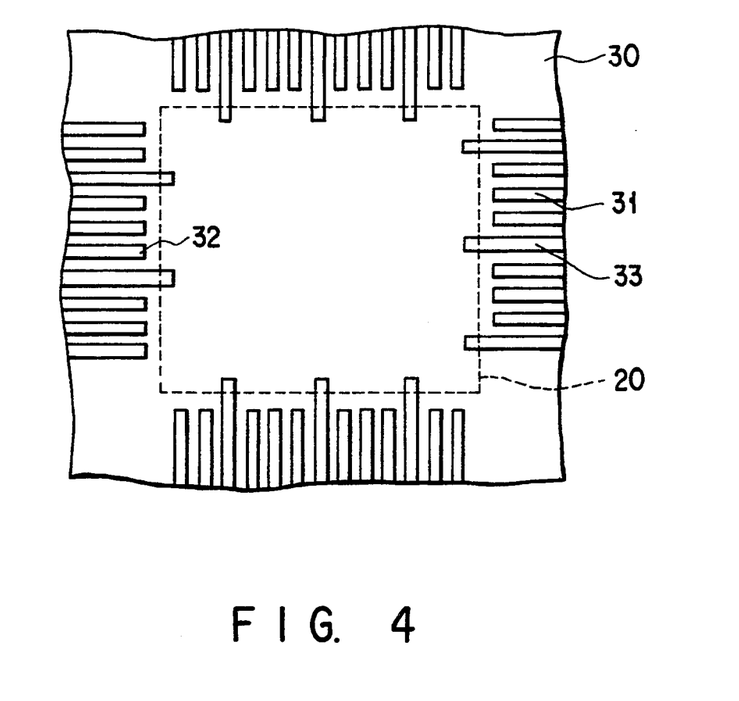
FIG. 4 is a plan view showing part of a lead wires on the printed circuit board on which the semiconductor device of FIG. 1 is mounted.

FIG. 3 is an enlarged cross sectional view of the printed circuit board and FIG. 4 is a plan view showing part of the circuit pattern near a portion of the printed circuit board on which the semiconductor device is mounted. As shown in FIGS. 3 and 4, a printed circuit is formed on the circuit board 30. The printed circuit is constructed by a plurality of lead wires 31, 32 and 33. The lead wires are connected to the front end portions of the outer lead portions 15B of the semiconductor device by soldering. In the connecting areas, solder portions 34, 35 and 36 are disposed. The lead wire 31 is connected to a power source, the lead wire 32 is connected to a signal line and the lead wire 33 is grounded. The grounded lead wire 33 is formed to extend into an area in which the metal plate 20 indicated by broken lines is disposed and the solder layers 34 and 35 are disposed on two portions of the load wire 33. The solder layer 34 is used for connection with the outer lead portion and the solder layer 35 is used for connection with the metal plate 20. The solder layer 36 for connection with the outer lead portion is disposed on each of the other lead wires 31 and 32. Each of the outer lead portions of the semiconductor device is connected to the circuit board 30 via solder by reflow, for example. The lead wires are formed on the circuit board 30 so as to be arranged on the surrounding area of the semiconductor device when the semiconductor device is mounted on the circuit board 30.

The solder layer 34 disposed on the lead wire 33 is connected to one of the outer lead portions 15B which serves as a ground line. In order to mount the semiconductor device on the circuit board 30 as shown in FIG. 1, the semiconductor device and the circuit board 30 are so aligned as to set the front end portions of the outer lead portions 15B of the semiconductor device in contact with the solder layer 34 and set the metal plate 20 in contact with the solder layer 35 and the semiconductor device is mounted by fellow. In this embodiment, the two solder layers 34 and 35 are formed on the single lead wire 33, thereby causing the metal plate 20 to be connected to the outer lead portion. However, the outer lead portion is not necessarily connected to the same lead wire to which the metal plate 20 is connected and it may be connected to another lead wire.

With the above structure, since the metal plate 20 has the shielding effect, the crosstalk can be prevented and the high frequency characteristic can be improved. Even in a high frequency semiconductor device whose operation frequency is 100 MHz or more, the crosstalk can be effectively prevented. Since the metal plate 20 is bonded to the insulating film 11 by use of the adhesive agent 19, it will not act as an obstacle to an increase in the number of pins and will not make the carrier tape forming process complicated. Further, warp or distortion will not remain in the carrier tape 10 owing to the rigidity of the metal plate 20 bonded to the insulating film 11 after it is divided into individual semiconductor devices. Therefore, in the step of mounting the semiconductor device on a printed circuit board or the like, the flatness of the outer lead portion can be improved and the adhesion of the outer lead portion to the printed circuit can be enhanced. Further, the mechanical strength of the package itself is enhanced by the presence of the metal plate 20 and the reliability of the semiconductor device after it is mounted on the board can be enhanced. In addition, an effect that heat generated from the semiconductor chip 1 is radiated from the metal plate 20 can be obtained.

The inventors of this application measured the degrees of warp of the carrier tape in the conventional semiconductor device and the semiconductor device of this invention. In the case of this invention, the thickness of the metal plate 20 is set to 300 μm, the length of one side of the external form is set to 27 mm, and the dimension of one side of a central space is set to 15 mm. As a result, the warp occurring in the carrier tape 10 in this invention was reduced to approximately 178 to 50 μm while the warp of approximately 442 μm occurred in the carrier tape in the conventional semiconductor device. Further, if grooves or cutout portions are formed in the metal plate 20 to reduce the stress, the warp or distortion occurring in the carrier tape can be further reduced.

In the above embodiment, an example wherein a pure copper plate is used as the metal plate 20 is explained, but an aluminum plate, duralumin plate or nickel-plated copper plate can be used.

Figure 5:
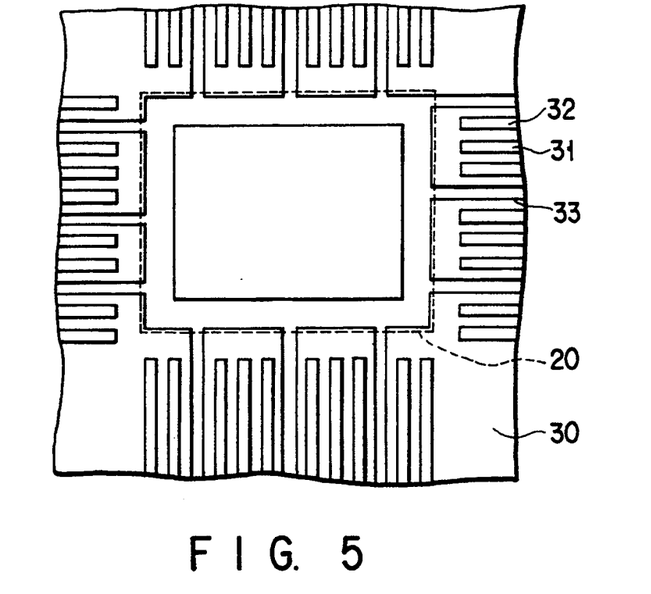
FIG. 5 is a plan view showing another example of the lead wires shown in FIG. 4.

FIG. 5 shows another example of the pattern of the printed circuit shown in FIG. 4. The power source lead wire 31 and signal lead wire 32 formed on the circuit board 30 are arranged along the peripheral portion of an area in which the semiconductor element is formed. The ground lead wire 33 has a ring-form portion which is disposed in an area inside the grounded lead wires 31 and 32 and is disposed below the semiconductor device and lead-out portions which are formed to extend from the ring-form portion into between the lead wires 31 and 32. With this structure, the metal plate 20 can be connected to any desired portion of the ring-form portion and the contact area therebetween can be made large so that the reliability can be enhanced.

Figure 6A:
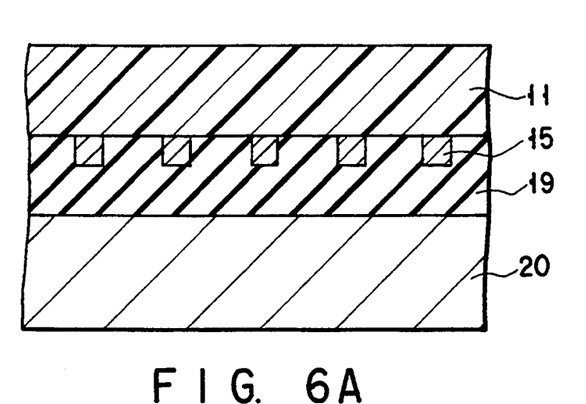
FIG. 6A is a cross sectional view taken along the line 6A—6A of the carrier tape shown in FIG. 2.
Figure 6B:
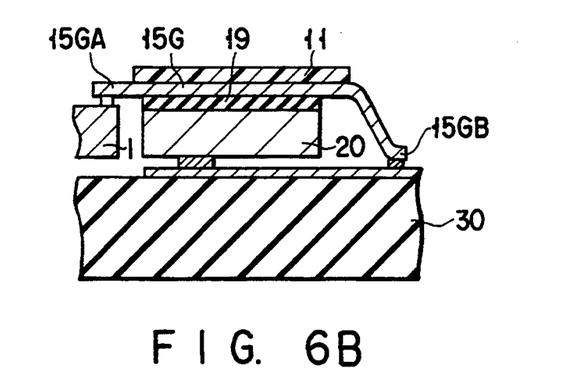
FIG. 6B is a partial cross sectional view showing the semiconductor device after mounted on the printed circuit board and corresponding to the cross section taken along the line 6B—6B of the carrier tape shown in FIG. 2.

FIG. 6A is a cross sectional view taken along the line 6A—6A of the insulating film 11 of FIG. 2 and FIG. 6B is a cross sectional view showing a portion of a semiconductor device after mounted on the printed circuit board and corresponding to a portion taken along the line 6B—6B. As shown in the figures, the adhesion agent 19 coated on the metal plate 20 which is bonded to the insulating film 11 is coated not only on the top surfaces of the leads 15 but also on the side surfaces thereof so as to bury the leads 15 in the adhesion agent 19. As a result, the moisture resistance can be enhanced and the insulation between the leads 15 can be enhanced.

Figure 7A:
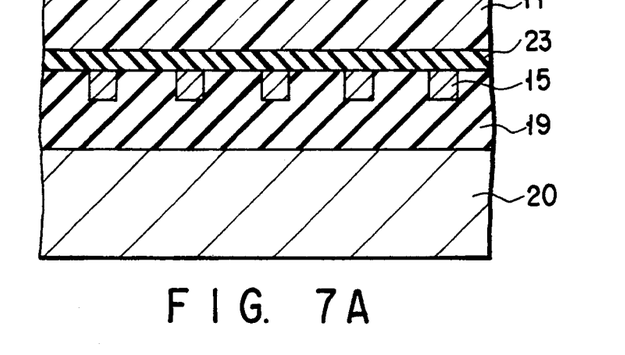
FIG. 7A is a cross sectional view showing another example of the structure taken along the line 6A—6A of the carrier tape shown in FIG. 2.
Figure 7B:
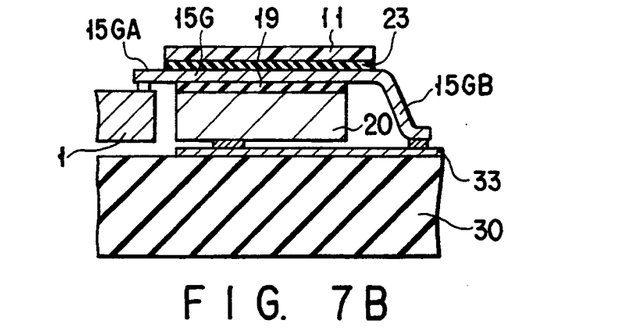
FIG. 7B is a partial cross sectional view showing another example of the structure of the semiconductor device after mounted on the printed circuit board and corresponding to the cross section taken along the line 6B—6B of the carrier tape shown in FIG. 2.

FIGS. 7A and 7B show another example of the structure of the carrier tape 10 and respectively correspond to FIGS. 6A and 6B. In this embodiment, leads 15 are bonded to the insulating film 11 via adhesion agent 23. As the adhesion agent 23, epoxy resin formed by mixing thermosetting epoxy resin into thermoplastic epoxy resin is used. If the thermosetting resin is thus mixed, the mechanical strength thereof can be adequately adjusted according to the content of the thermosetting resin. Further, also in this embodiment, the lead 15 is coated with the adhesion agent 19, thereby enhancing the insulation and moisture resistance of the leads 15.

Figure 8A:
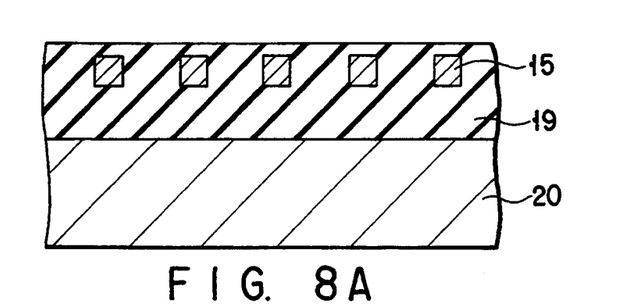
FIG. 8A is a cross sectional view showing still another example of the structure taken along the line 6A—6A of the carrier tape shown in FIG. 2.
Figure 8B:
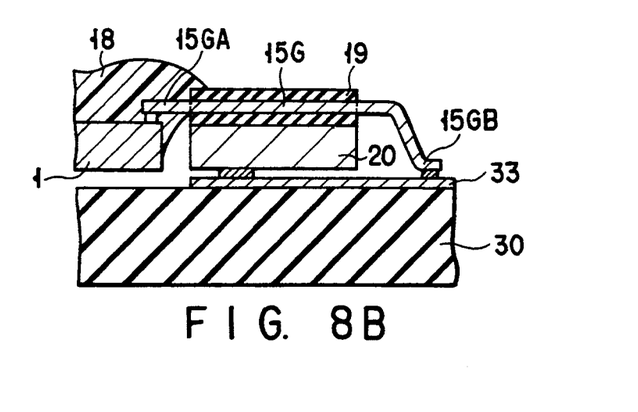
FIG. 8B is a partial cross sectional view showing still another example of the structure of the semiconductor device after mounted on the printed circuit board and corresponding to the cross section taken along the line 6B—6B of the carrier tape shown in FIG. 2.

The carrier tape shown in FIGS. 7A and 7B is constructed by three layers of an insulating film, adhesion agent and lead and is generally called a three-layered carrier tape. In addition to the three-layered carrier tape, the two-layered carrier tape shown in FIGS. 6A and 6B and a single-layered carrier tape shown in FIGS. 8A and 8B are provided as the carrier tape and can be used in the semiconductor device of this invention. The single-layered carrier tape is usually formed by etching a tape-form metal plate such as a Cu plate having a thickness of approximately 70 μm. The two-layered carrier tape is formed by copper-plating or sputtering a wiring pattern with a thickness of approximately 20 to 40 μm on the insulating film. Further, a method of spraying polyimide or the like on a copper foil which is not patterned, patterning them after they are fixed together and then etching them can be provided. The three-layered carrier tape has a structure obtained by bonding a metal foil such as electrolytic copper or rolled copper to a high-polymer film by use of bonding agent and the surface of the metal foil is made rough to increase the bonding force. In this state, etching or surface plating is effected. After they are bonded together, the adhesive agent is cured. Then, the etching process is effected by photolithography, for example, to form a wiring pattern. An adhesive material such as polyimide, epoxy, acrylic or phenol butyral can be used as the above adhesion agent. The leads constructing the wiring pattern on the carrier tape is generally electroplated to enhance the corrosion resistance thereof. The plating is effected by immersion-plating or electroplating Au or Sn. The insulating film can be formed by using a material such as polyester or polyparabanic acid other than the polyimide.

Since the single-layered carrier tape is used in the case shown in FIGS. 8A and 8B, the metal plate 20 is directly connected to leads 15 via adhesion agent 19. At this time, in order to attain a sufficiently large protection effect, it is necessary to bury the leads 15 in the adhesion agent 19. Since the lead and metal wire are connected to the same lead wire on the circuit board in both of the two cases shown in FIGS. 7A and 7B and FIGS. 8A and 8B, the lead 15 must be formed such that the surface of the metal plate which is set in contact with the lead wire and the front end portion of the outer lead portion 15B will be set in substantially the same plane.

Figure 9A:
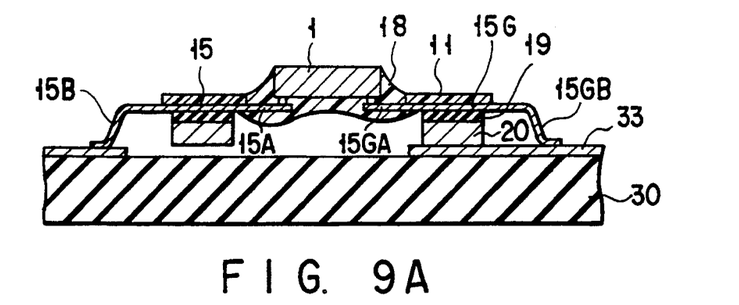
FIGS. 9A to 9C are cross sectional views of semiconductor devices according to second to fourth embodiments of this invention which are mounted on a printed circuit board.
Figure 9B:
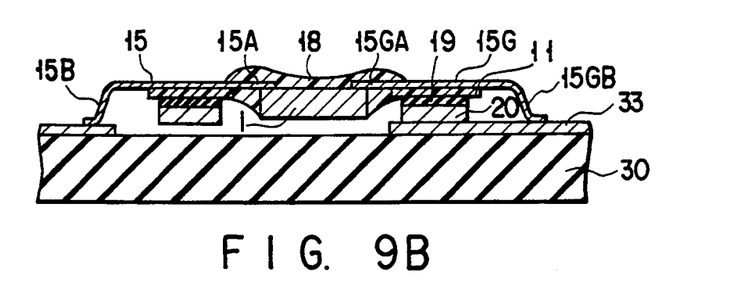
Figure 9C:
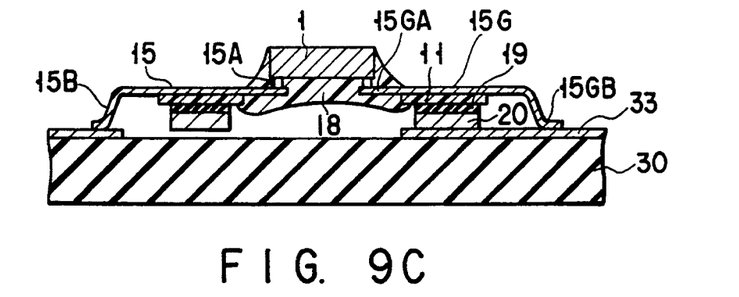

Next, some examples of the arrangement of the semiconductor chip and the leads are explained with reference to FIGS. 9A, 9B and 9C. The main surface of the semiconductor device shown in FIG. 1 is set to face up and the insulating film 11 is formed on the leads 15 when the surface of the semiconductor chip 1 on which the leads 15 are connected is defined as the main surface, and this arrangement is defined as a first type (face-up/film-up type). In addition to the first type, there are a second type or face-down/film-up type (refer to FIG. 9A) in which the insulating film 11 is formed on the leads 15 and the main surface of the semiconductor chip 1 is set to face down and face the circuit board 30, a third type or face-up/film-down type (refer to FIG. 9B) in which the insulating film 11 is formed under the leads 15 and the main surface of the semiconductor chip 1 is set to face up and a fourth type or face-down/film-down type (refer to FIG. 9C) in which the insulating film 11 is formed under the leads 15 and the main surface of the semiconductor chip 1 is set to face down and face the circuit board 30, and this invention can be applied to any one of the above types. However, since the insulating film 11 is formed under the leads 15 in the third and fourth types, the metal plate 20 must be formed below the leads 15 and the leads 15 are not coated with the adhesion agent 19 for bonding the metal plate 20, and the semiconductor devices of these types are not superior to the semiconductor devices of the first and second types in the insulation between the leads and the moisture resistance.

Figure 10:
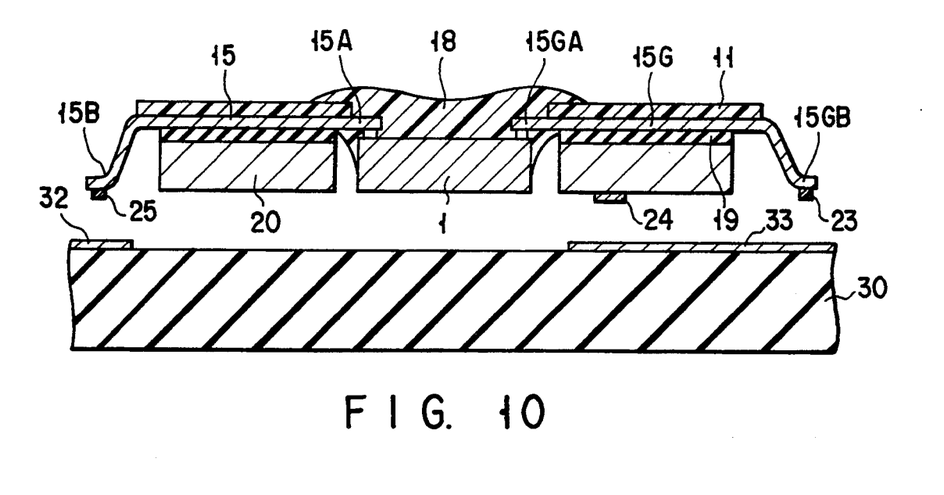
FIG. 10 is a cross sectional view of a semiconductor device according to a fifth embodiment of this invention.

Next, the fifth embodiment of this invention is explained with reference to FIG. 10. In this embodiment, a solder bump 24 is formed to connect the metal plate 20 to a grounded lead wire 33 formed on the circuit board 30. Further, a solder bumps 25 and 23 are formed on the front end of the outer leads 15B and 15GB, and the semiconductor device is mounted and subjected to the heat treatment to connect the front end of the outer lead 15B to the lead wire 32, and to connect the front end of the outer lead 15GB and metal plate 20 to the grounded lead wire 33, respectively. Also, in this embodiment, since the metal plate 20 is connected to the lead wire 33, the contact surface of the metal plate 20 with the lead wire 33 and the front end of the outer lead portion 15GB is formed to be set in the same plane. However, since the semiconductor chip 1 is not set in contact with the circuit board 30, it is not always necessary to set the contact surface in the above same plane.

Figure 11:
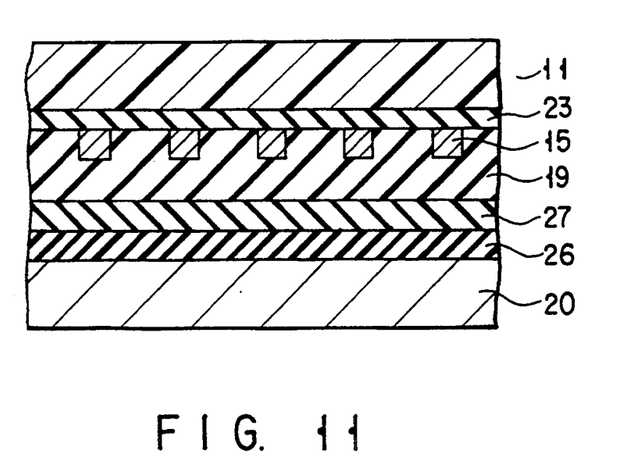
FIG. 11 is a cross sectional view corresponding to the cross section taken along the line 6A—6A of the carrier tape shown in FIG. 2, for illustrating a semiconductor device according to a sixth embodiment of this invention.

FIG. 11 is a cross sectional view showing a semiconductor device according to a sixth embodiment of this invention and corresponding to the cross section taken along the line 6A—6A of the carrier tape shown in FIG. 2. The carrier tape has an insulating film 11 formed of polyimide, for example, and a wiring pattern constructed by leads 15 formed of Cu and they are bonded together by adhesion agent 23 such as polyimide. Further, in this embodiment, an intermediate film 27 formed of high-polymer insulator such as polyimide is inserted between the metal plate 20 and the leads 15. The intermediate film 27 is bonded to the metal plate 20 by use of polyimide adhesion agent 26, for example. In order to bond the carrier tape and the intermediate film 27 together, adhesion agent 19 formed of resin which is formed by mixing thermosetting epoxy resin into thermoplastic epoxy resin is used, for example. Since the adhesion agent 19 completely buries an exposed portion of the leads 15, sufficiently high insulating protection for the leads 15 can be obtained. Further, if the intermediate film 27 is used, the metal plate 20 can be effectively prevented from being separated by heat generated at the time of mounting and the temperature cycle at the time of manufacturing since the thermal expansion coefficients of Cu used for forming the leads 15 and polyimide which is a material of the intermediate film 27 are close to each other.

Figure 12:
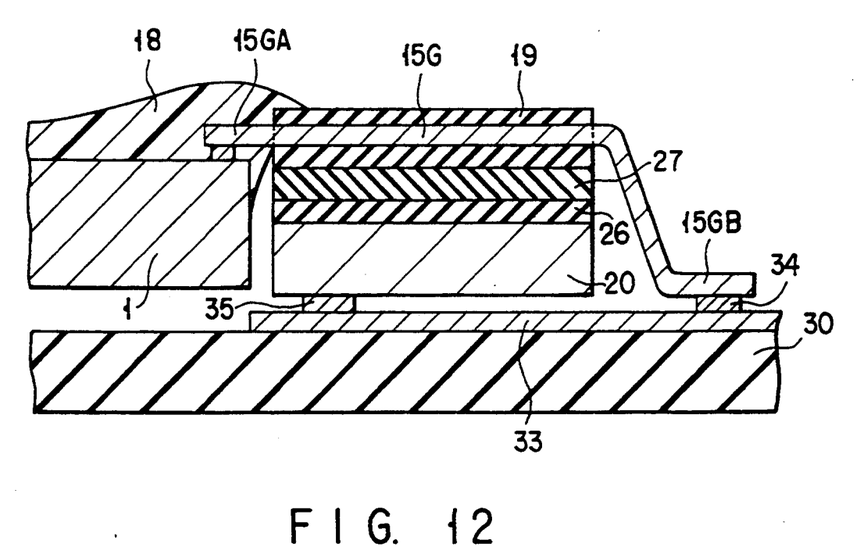
FIG. 12 is a cross sectional view showing an example of the structure after mounted on a printed circuit board and corresponding to the cross section taken along the line 6A—6A of the carrier tape shown in FIG. 2, for illustrating a semiconductor device according to a sixth embodiment of this invention.

The structure in which insulation between the metal plate 20 and the leads 15 is made sufficiently high by use of the intermediate film 27 is suitable for the single-layered carrier tape shown in FIG. 12 or a thin lead frame with a thickness of approximately 80 μm. Since no insulating film for supporting the leads 15 is used in the single-layered carrier tape, the leads 15 tend to be bent or irregularly arranged, but the metal plate 20 serves not only as a shield plate but also as a reinforcing plate so as to prevent the irregular arrangement or bent of the leads 15 and increase the mechanical strength of the package. Further, the intermediate film 27 more effectively ensures sufficient insulation between the metal plate 20 and the leads 15.

Figure 13:
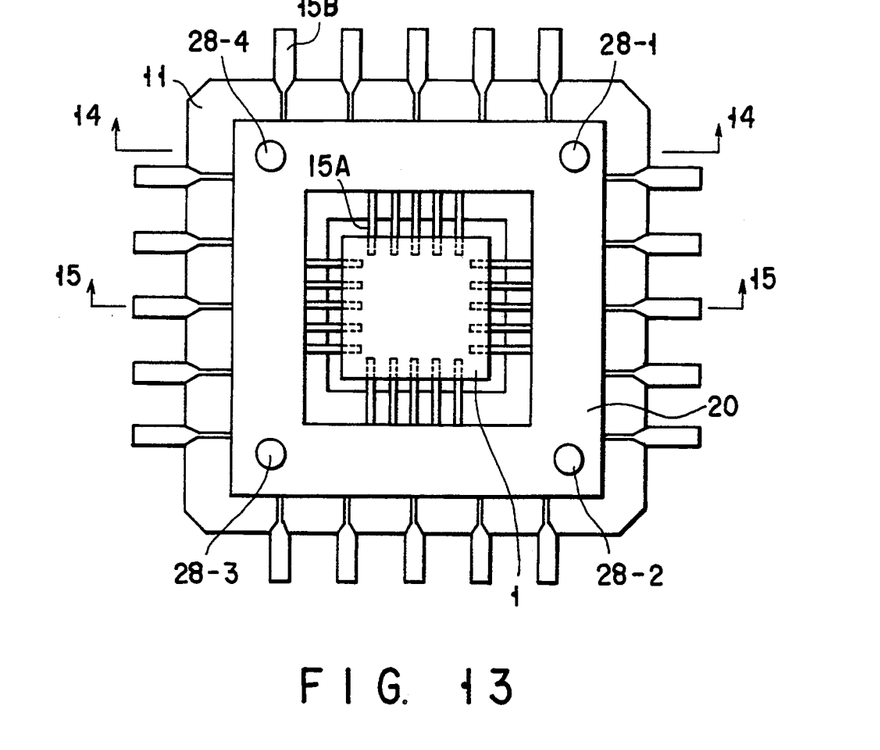
FIG. 13 is a plan view of a semiconductor device according to a fifth embodiment of this invention as viewed from the bottom.
Figure 14:
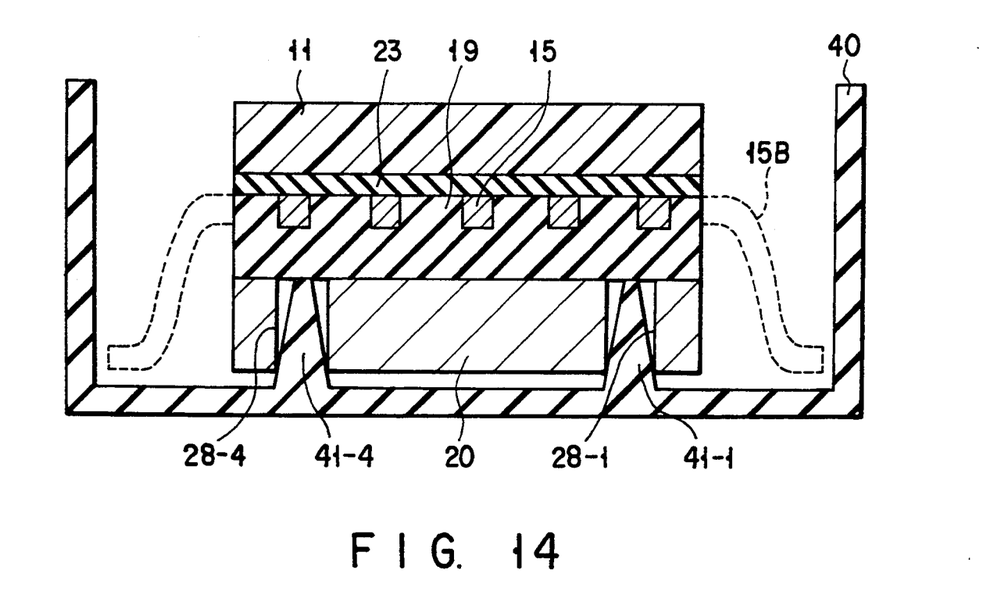
FIG. 14 is a cross sectional view taken along the line 14—14 of FIG. 13 and showing the semiconductor device of FIG. 13 set in a packing tray.
Figure 15:
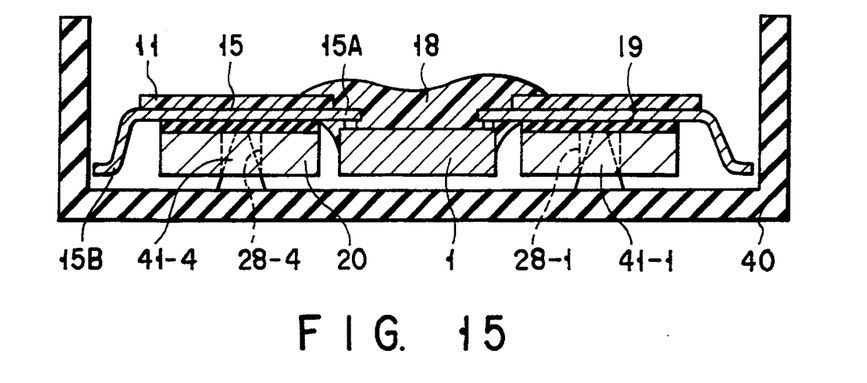
FIG. 15 is a cross sectional view taken along the line 15—15 of FIG. 13 and showing the semiconductor device of FIG. 13 set in a packing tray.

FIG. 13 is a plan view of a semiconductor device according to an eighth embodiment of this invention as viewed from the bottom thereof, FIGS. 14 and 15 show the semiconductor device of FIG. 13 set in a packing tray, FIG. 14 is a cross sectional view taken along the line 14—14 of FIG. 13 and FIG. 15 is a cross sectional view taken along the line 15—15 of FIG. 13. In this embodiment, holes 28-1 to 28-4 are formed in the four corner portions of the metal plate 20 in each of the above embodiments. As shown in FIGS. 14 and 15, a packing tray 40 having projections 41-1 to 41-4 formed on the bottom portion in positions corresponding to the holes 28-1 to 28-4 is provided and the semiconductor device is fixed by engaging the projections 41-1 to 41-4 into the holes 28-1 to 28-4 of the metal plate 20.

With the above structure, since the semiconductor device can be fixed on the packing tray, storage and transfer of the semiconductor device can be simplified.

If the leads 15 are placed in the holes 28-1 to 28-4 when the holes 28-1 to 28-4 are formed, there occurs a possibility that the projections may damage the leads 15, and therefore, it is necessary to select positions different from the positions of the leads when the holes 28-1 to 28-4 are formed. FIG. 14 is a cross sectional view taken along the line 14—14 of the semiconductor device shown in FIG. 13, and since the outer lead portion 15B cannot be observed in the above cross section, the corresponding portion is indicated by broken lines. Likewise, FIG. 15 is a cross sectional view taken along the line 15—15 of the semiconductor device shown in FIG. 13, and since the holes 28-1 to 28-4 of the metal plate 20 and the projections 41-1 to 41-4 in the packing tray 40 cannot be observed in the above cross section, the corresponding portions are indicated by broken lines.

Figure 16A:
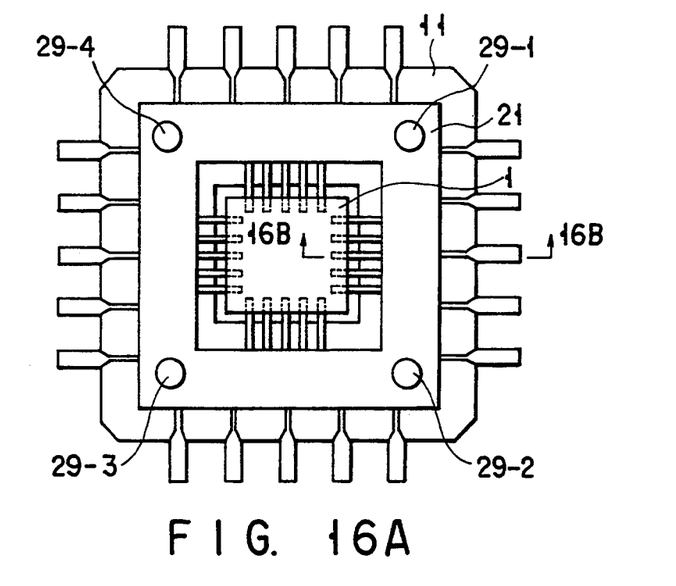
FIG. 16A is a plan view of a semiconductor device according to a ninth embodiment of this invention as viewed from the bottom.
Figure 16B:
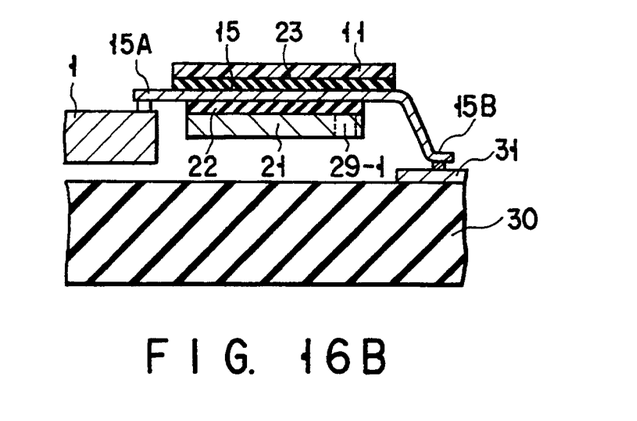
FIG. 16B is a partial cross sectional view taken along the line 16B—16B of the semiconductor device shown in FIG. 16A.

FIG. 16A is a plan view of a semiconductor device according to a ninth embodiment of this invention as viewed from the bottom thereof and FIG. 16B is a partial cross sectional view taken along the line 16B—16B of the semiconductor device shown in FIG. 16A. As shown in FIG. 16A, a reinforcing plate 21 is bonded to an insulating film 11 formed of polyimide, for example, and having leads 15 attached thereto by use of adhesive agent 22. The material of the reinforcing plate 21 may be metal such as copper and may be insulator if it has a sufficiently large rigidity since it is not connected to the grounded lead. Holes 29-1 to 29-4 are formed in the four corner portions of the reinforcing plate 21. Also, in this case, a packing tray 40 having projections 41-1 to 41-4 corresponding in position to the holes 29-1 to 29-4 and formed on the bottom surface can be used and the semiconductor device can be fixed by engaging the projections 41-1 to 41-4 into the holes 29-1 to 29-4.

Figure 17:
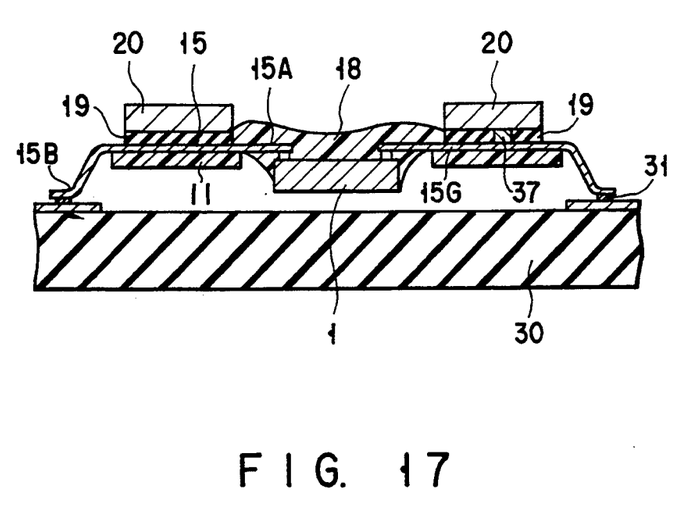
FIG. 17 is a cross sectional view of a semiconductor device according to a tenth embodiment of this invention which is mounted on a printed circuit board.

Next, a tenth embodiment is explained with reference to FIG. 17. In the first to eighth embodiments, the metal plate 20 is disposed near the circuit board 30. This structure is suitable for connection with the lead wires on the circuit board, but it is also possible to dispose the metal plate above the leads 15. With this structure, the metal plate 20 must be electrically connected to a grounded lead 15 among the leads constituting a circuit pattern. For this purpose, a projection or bump 37 for connection is formed on the metal plate 20 or lead 15 to electrically connect the metal plate and lead to each other. In order to connect the metal plate 20 to the wiring pattern containing the lead 15, insulating adhesive agent 19 is used, and when the projection 37 is depressed between the metal plate and the lead at the bonding time and the adhesive agent is excluded from the bonding portion, thereby effectively electrically connecting them together. The leads 15 are selectively connected to the lead wires 31 formed on the circuit board 30. This structure can be applied to a semiconductor device in which an insulating film is not bonded to the lead 15 as shown in FIG. 8. Further, with the above structures, it is possible to dispose an insulating intermediate film of polyimide, for example, between the lead 15 and the metal plate 20.

In the semiconductor device explained in the above embodiments, a printed circuit board is used as a base plate for mounting the semiconductor device, but a semiconductor substrate having an integrated circuit, passive elements or both of them formed thereon can be used. Lead wires of aluminum, for example, are formed on the surface of the semiconductor device by sputtering, for example, and then the surface of the resultant structure is plated by use of Au, Sn or the like. After this, a semiconductor device may be mounted on the semiconductor structure in the same manner as in the former embodiments.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
    a semiconductor chip;
    a wiring pattern having an under surface and having leads each including an inner lead portion connected to said semiconductor chip and an outer lead portion extending from said inner lead portion;
    a shield plate having a surface facing the under surface of the wiring pattern and having a lower surface;
    an insulating adhesive agent bonding said shield plate to the under surface of the wiring pattern;
    a base plate on which said semiconductor chip is mounted; and
    a plurality of lead wires on said base plate and connected to said outer lead portions, at least one of said plurality of lead wires being grounded and electrically connected to said shield plate;
    the lower surface of said shield plate and the connections of said lead wires to said outer lead portions being in substantially the same plane.

2. A semiconductor device comprising;
    a semiconductor chip;
    a wiring pattern having an under surface and having leads each including an inner lead portion connected to said semiconductor chip and an outer lead portion extending from said inner lead portion;
    a shield plate having a surface facing the under surface of the wiring pattern;
    an insulating adhesive agent bonding said shield plate to the under surface of the wiring pattern;
    a base plate on which said semiconductor chip is mounted; and
    a plurality of lead wires on said base plate and connected to said outer lead portions, at least one of said plurality of lead wires being grounded and electrically connected to said shield plate; and
    a projection on one of said shield plate and said grounded lead wire, said shield plate and said grounded lead wire being electrically connected to each other via said projection.

3. A semiconductor device comprising:
    a semiconductor chip;
    an insulating film having a device hole in which said semiconductor chip is disposed;
    a wiring pattern having leads formed on one of the top and under surfaces of said insulating film and each including an inner lead portion and an outer lead portion formed to extend from said inner lead portion;
    a reinforcing plate disposed to face the under surface of said insulating film and having a hole with which a projecting portion of a packing tray is engaged; and
    adhesive agent for bonding said reinforcing plate to the under surface of said insulating film.

4. A semiconductor device according to claim 3, wherein said reinforcing plate is a metal plate.

5. A semiconductor device according to claim 4, which further comprises a base plate on which said semiconductor chip is mounted and a plurality of lead wires connected to said outer lead portions on said base plate and in which at least one of said lead wires is grounded and electrically connected to said reinforcing plate.

6. A semiconductor device comprising:
    a semiconductor chip;
    an insulating film having a device hole in which said semiconductor chip is disposed;

a wiring pattern having leads formed on the top surface of said insulating film and each including an inner lead portion connected to said semiconductor chip and an outer lead portion formed to extend from said inner lead portion;

a shield plate disposed to face the top surface of said insulating film;

insulating adhesive agent for bonding the under surface of said shield plate to the top surface of said insulating film;

a base plate on which said semiconductor chip is mounted;

a plurality of lead wires formed on said base plate and including at least one lead wire which is grounded, said at least one grounded lead wire being electrically connected to at least one of said leads which is to be grounded; and a projection formed on one of the under surface of said shield plate and said grounded lead inside said wiring pattern, for electrically connecting said grounded lead to the under surface of said shield plate.

7. A semiconductor device according to claim 6, wherein said wiring pattern is buried in said adhesive agent.

8. A semiconductor device according to claim 1, further comprising an insulating film having a device hole in which said semiconductor chip is disposed.

9. A semiconductor device according to claim 2, further comprising an insulating film having a device hole in which said semiconductor chip is disposed.

* * * * *